(12) United States Patent
Janakiraman et al.

(10) Patent No.: US 6,387,207 B1
(45) Date of Patent: May 14, 2002

(54) INTEGRATION OF REMOTE PLASMA GENERATOR WITH SEMICONDUCTOR PROCESSING CHAMBER

(75) Inventors: Karthik Janakiraman, Santa Clara; Kelly Fong, San Francisco; Chen-An Chen; Paul Le, both of San Jose; Rong Pan, San Francisco; Shankar Venkataraman, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/561,325

(22) Filed: Apr. 28, 2000

(51) Int. Cl.[7] .............................................. H01L 21/00
(52) U.S. Cl. ................... 156/345; 118/723 ME
(58) Field of Search .................... 156/345; 118/723 ME

(56) References Cited

U.S. PATENT DOCUMENTS 5,609,774 A * 3/1997 Yamazaki et al. .......... 156/345

* cited by examiner

Primary Examiner—Thi Dang
(74) Attorney, Agent, or Firm—Townsend and Townsend and Crew

(57) ABSTRACT

A compact, self-contained remote plasma generator is mounted on the lid of a semiconductor processing chamber to form an integrated substrate processing system. The remote plasma generator is activated in a clean operation to generate cleaning plasma species to provide better cleaning of the chamber and lower perfluorocarbon emissions than in situ plasma clean processes. A three-way valve is adjustable to control gas flow to the chamber. During the clean operation, the three-way valve directs a cleaning plasma precursor from a first gas line to the remote plasma generator to generate cleaning plasma species which are flowed to the chamber for cleaning deposits therein. During a deposition process, the three-way valve directs a first process gas from the flat gas line to the chamber, bypassing the remote plasma generator. The first process gas is typically mixed with a second process gas supplied from a second gas line in a mixing device prior to entering the chamber for depositing a layer on a substrate disposed therein.

21 Claims, 11 Drawing Sheets

INTEGRATION OF REMOTE PLASMA GENERATOR WITH SEMICONDUCTOR PROCESSING CHAMBER

BACKGROUND OF THE INVENTION

The invention relates generally to apparatus for substrate processing and, more particularly, to integration of a compact, self-contained remote plasma generator with a substrate processing system.

The fabrication of semiconductor products, such as integrated circuits, often involves the formation of layers on a substrate, such as a silicon wafer. Various techniques have been developed for the deposition processes, as the layers often involve different materials. For example, a metal layer might be deposited and patterned to form conductive interconnects, or a dielectric layer might be formed to electrically insulate one conductive layer from another. Some types of layer formation processes that have been used to form layers of dielectric materials and other materials are chemical vapor deposition (CVD) processes.

CVD processes include the deposition processes, in which precursor gases or vapors react in response to the heated surface of the substrate, as well as plasma-enhanced CVD ("PECVD") processes, in which electro-magnetic energy is applied to at least one precursor gas or vapor to transform the precursor into a more reactive plasma. Forming a plasma can lower the temperature required to form a film, increase the rate of formation, or both. Therefore, plasma enhanced process are desirable in many applications.

When a layer is formed on a substrate, some material is usually also deposited on the walls of the deposition chamber and other components of the deposition system as residue. The material on the walls of the chamber is generally undesirable because the residue can build up and become a source of particulate contamination, causing wafers to be rejected. Several cleaning procedures have been developed to remove residue from inside the chamber. One type of procedure, known as a "wet-clean" is performed by partially disassembling the deposition chamber and wiping the surfaces down with appropriate cleaning fluids. Other types of cleaning processes utilize a plasma to remove the residue by converting it to a volatile product that can be removed by the chamber exhaust system. These processes are known as "dry" cleans.

There are two general types of plasma dry cleaning processes. One type forms a plasma inside the processing chamber, or "in situ". An example of an in situ plasma clean uses $NF_3$ and $C_2F_6$ gases to form free fluorine for removing residue in the chamber interior. The other type forms a plasma in a remote plasma generator and then flows the ions into the processing chamber. Such a remote plasma cleaning process offers several advantages, such as providing a dry clean capability to a deposition system that does not have an in situ plasma system. Furthermore, a remote plasma system might be more efficient at converting cleaning plasma precursor gases or vapors into a plasma, and forming the plasma outside the chamber protects the interior of the chamber from potentially undesirable by-products of the plasma formation process, such as plasma heating and sputtering effects. The use of a remote plasma system also reduces perfluorocarbon (PFC) emissions. On the other hand, remote plasma systems suitable for CVD systems are typically expensive and bulky, and may be impractical or economically unfeasible. Retrofitting existing CVD systems with a remote plasma generator may require substantial alterations that are costly and time-consuming.

SUMMARY OF THE INVENTION

The present invention is directed toward the integration of a compact, self-contained, low-cost remote plasma generator with a substrate processing apparatus. In specific embodiments, the remote plasma generator is mounted to the lid of a process chamber above the substrate holder disposed therein. A gas delivery system is provided to direct a cleaning plasma precursor through the remote plasma generator to the process charmer for generating cleaning plasma species to clean the chamber in a clean operation. During deposition, the gas delivery system directs one or more process gases into the process chamber while bypassing the remote plasma generator. A mixing device provides a short, direct flow path for the cleaning plasma species from the remote plasma generator to the process chamber during the clean operation, and long mixing paths for mixing a plurality of process gases during the deposition process. The integration requires only minor alterations to existing process chambers, and is particularly suitable for retrofitting such chambers at a low cost with minimal system downtime. The integration is sufficiently robust to be adaptable to different chamber configurations. In addition to significantly reducing PFC emissions, the integrated system increases throughput by reducing clean times, thereby lowering operating cost. The integrated system may also extend the life of 1he CVD system by eliminating harmful effects to the chamber interior caused by in situ plasma cleaning processes.

In accordance with an aspect of the preset invention, a substrate processing system includes a housing defining a process chamber, and a substrate support for supporting a substrate during substrate processing in the process chamber. The system further includes a remote plasma generator having au inlet and an outlet, and a gas delivery system for introducing gases into the process chamber. The gas delivery system includes a three-way valve having a valve inlet, a fist valve outlet and a second valve outlet. The three-way valve is adjustable to switch flow between a first valve path from the valve inlet to the first valve outlet and a second valve path from the valve inlet to the second valve outlet. A first inlet flow conduit is coupled between the outlet of the remote plasma generator and the process chamber. A remote plasma conduit is coupled between the first valve outlet of the three-way valve and the inlet of the remote plasma generator. A second inlet flow conduit is coupled between the second valve outlet of the three-way valve and the process chamber.

In some embodiments, the gas delivery system includes a third inlet flow conduit coupled with the process chamber. The gas delivery system includes a mixing block having a first flow path for directing gas flow from the remote plasma generator through the first inlet flow conduit to the chamber. The mixing block includes a second flow path coupled between the second inlet flow conduit and the process chamber, and a third flow path coupled between the third inlet flow conduit and the process chamber. The second and third flow paths in the mixing block are at least partially overlapped and include multiple turns to induce mixing of process gases from the second and third inlet flow conduits.

In a preferred embodiment, the remote plasma generator is mounted on the lid of the housing disposed generally above the substrate support in the chamber. A ceramic isolator is coupled between the remote plasma generator and the process chamber, and includes a flow passage to facilitate gas flow between the remote plasma generator and the process chamber. During an in situ plasma process in the chamber, the process gas may backstream toward the remote plasma generator. The presence of the process gas between the RF hot components of the chamber on one side and the grounded mounting hardware for mounting the remote plasma generator to the chamber on the other side may induce formation of a secondary plasma in that region. The secondary plasma may cause instability of the plasma inside the chamber and adversely affect the deposition. The ceramic isolator isolates the RF hot components of the chamber from the grounded mounting hardware to avoid formation of a secondary plasma In accordance with yet another aspect of the invention, a substrate processing system includes a housing defining a process chamber, a substrate support for supporting a substrate during substrate processing in the process chamber, and a remote plasma generator. The system further includes a first gas line, a second gas line, a first gas supply for a first gas, a second gas supply for a second gas, and a third gas supply for a third gas. A device is provided for coupling the first gas supply with the first gas line to flow the first gas through the first gas line and the remote plasma generator to the process chamber during a first operation. During a second operation, the device couples the second gas supply with the first gas line to flow the second gas trough the first gas line to the process chamber bypassing the remote plasma generator, couples the third gas supply with the second gas line to flow the third gas into the process chamber, and mixes the second gas and the third gas together prior to flowing the second and third gases into the process chamber.

DESCRIPTION OF THE SPECIFIC EMBODIMENTS

I. Example Substrate Processing System

Figure 1A:
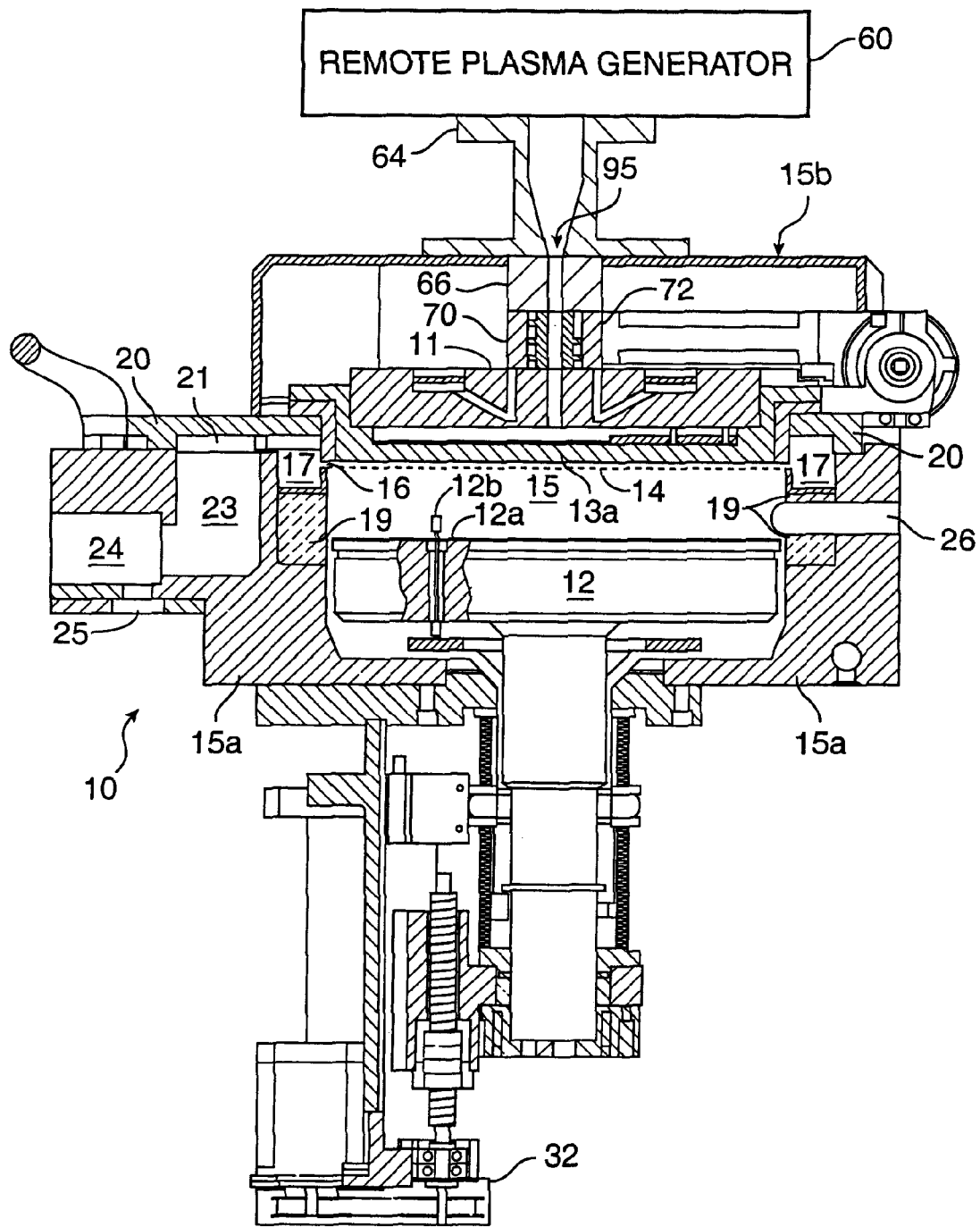
FIGS. 1A and 1B are vertical, cross-sectional views of one embodiment of a chemical vapor deposition apparatus according to the present invention.
Figure 1B:
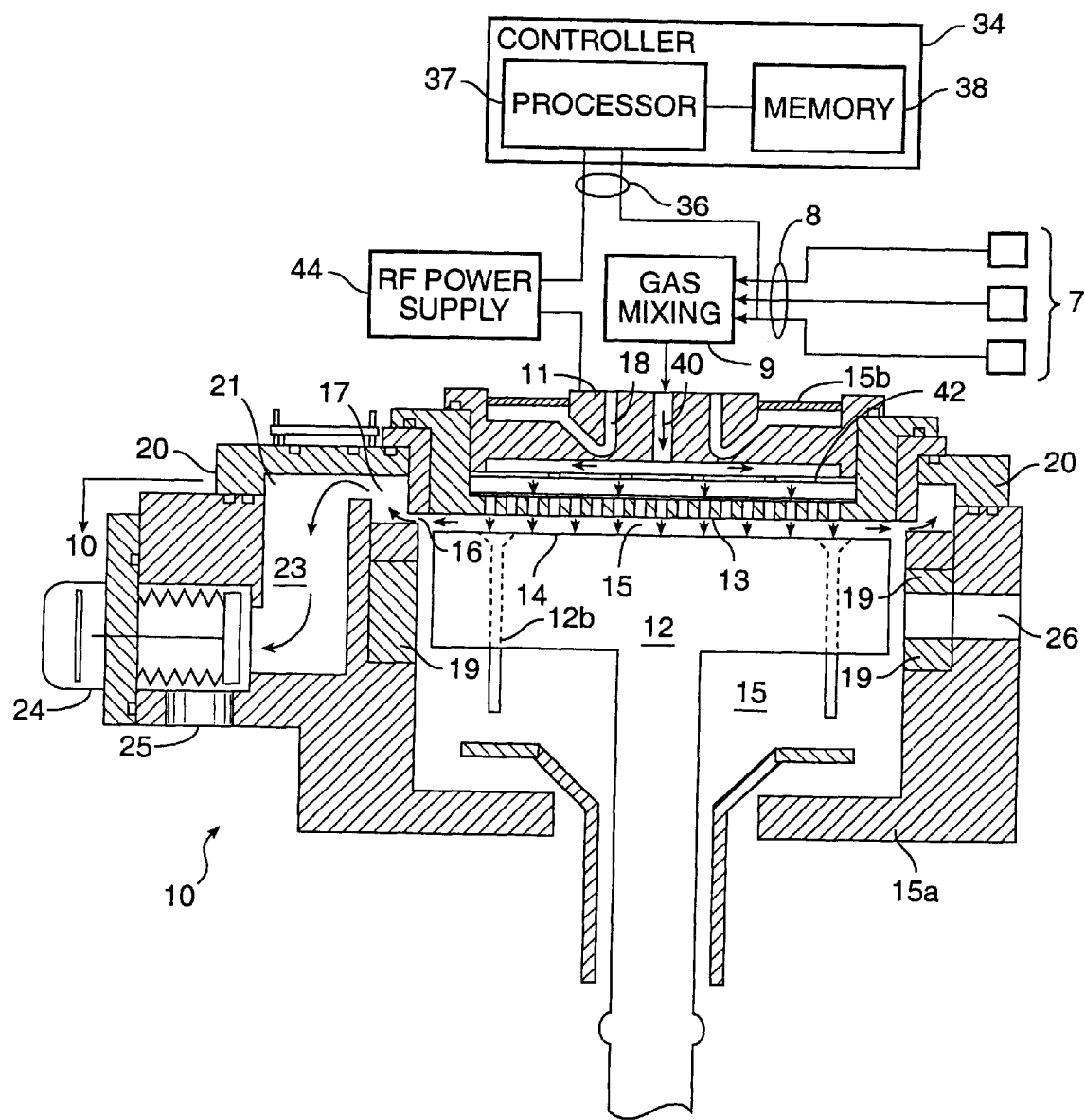
Figure 1C:
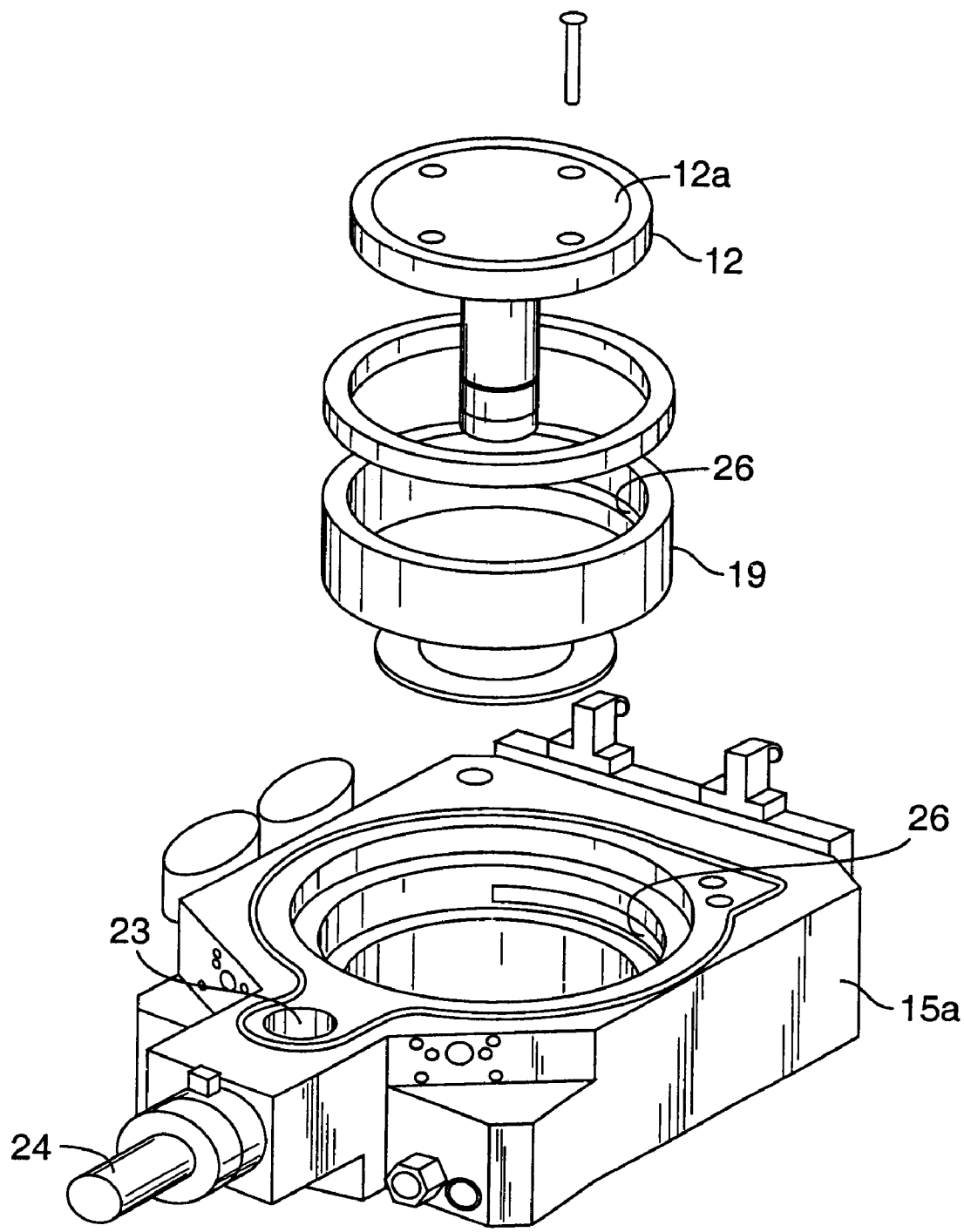
FIGS. 1C and 1D are exploded perspective views of parts of the CVD chamber depicted in FIG. 1A.
Figure 1D:
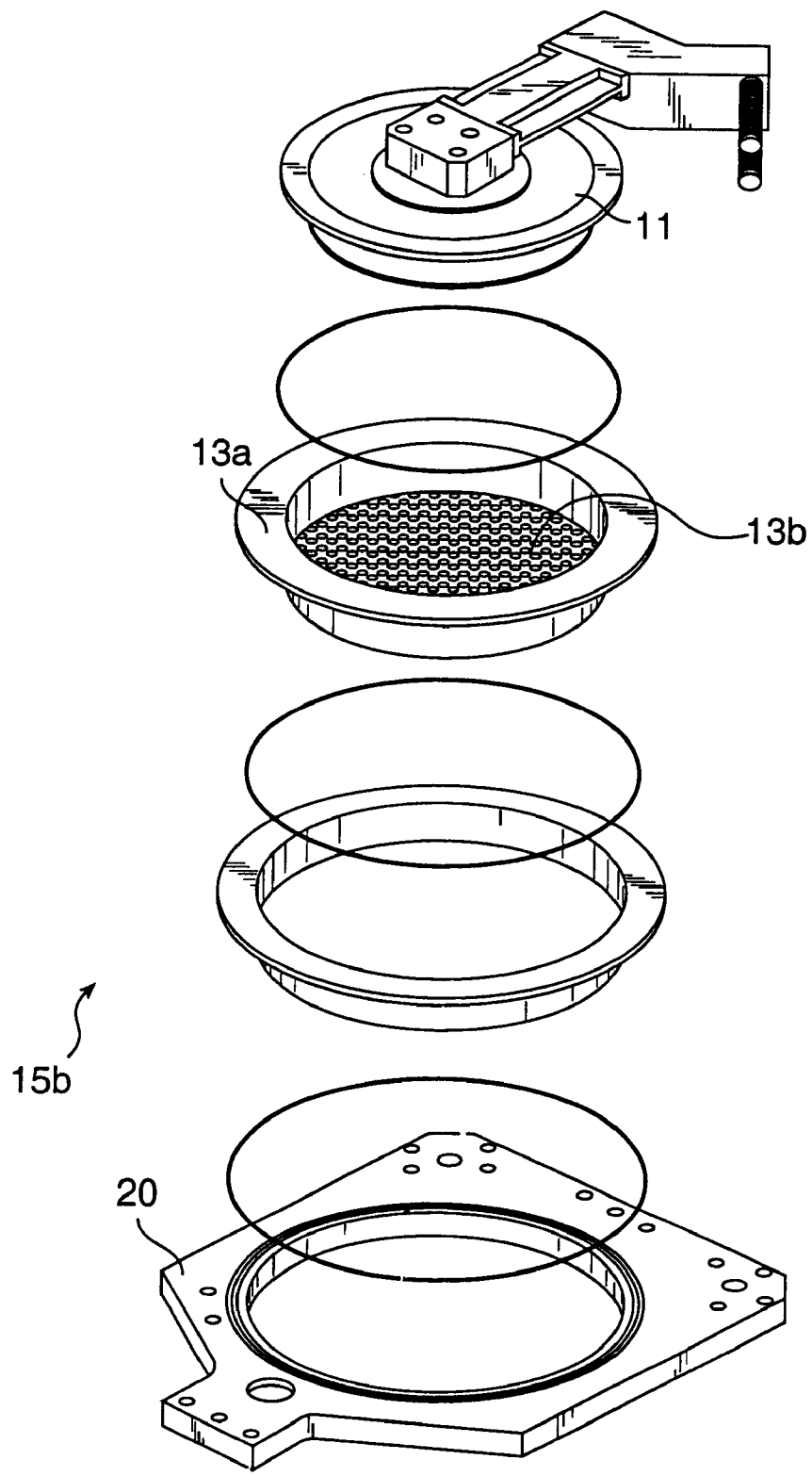

One suitable substrate processing system in which the method of the present invention can be carried out is shown in FIGS. 1A and 1B, which are vertical, cross-sectional views of a CVD system 10, having a vacuum or processing chamber 15 that includes a chamber wall 15a and a chamber lid assembly 15b. The chamber wall 15a and chamber lid assembly 15b are shown in exploded, perspective views in FIGS. 1C and 1D.

A. Process Chamber

The CVD system 10 contains a gas distribution fold 11 for dispersing process gases to a substrate (not shown) that rests on a heated pedestal 12 centered within the process chamber 15. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 1A) and an upper processing position (indicated by dashed line 14 in FIG. 1A and shown in FIG. 1B), which is closely adjacent to the manifold 11. A centerboard (not shown) includes sensors for providing information on the position of the wafers.

Deposition and carrier gases are introduced into the chamber 15 through perforated holes 13b (FIG. 1D) of a conventional flat, circular gas distribution faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold 11, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. A portion of these heat exchanging passages 18 in the lid assembly 15b of chamber 15 is shown FIG. 1B. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et at. The U.S. Pat. No. 5,558,717 patent is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment shown in FIG. 1B, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1E:
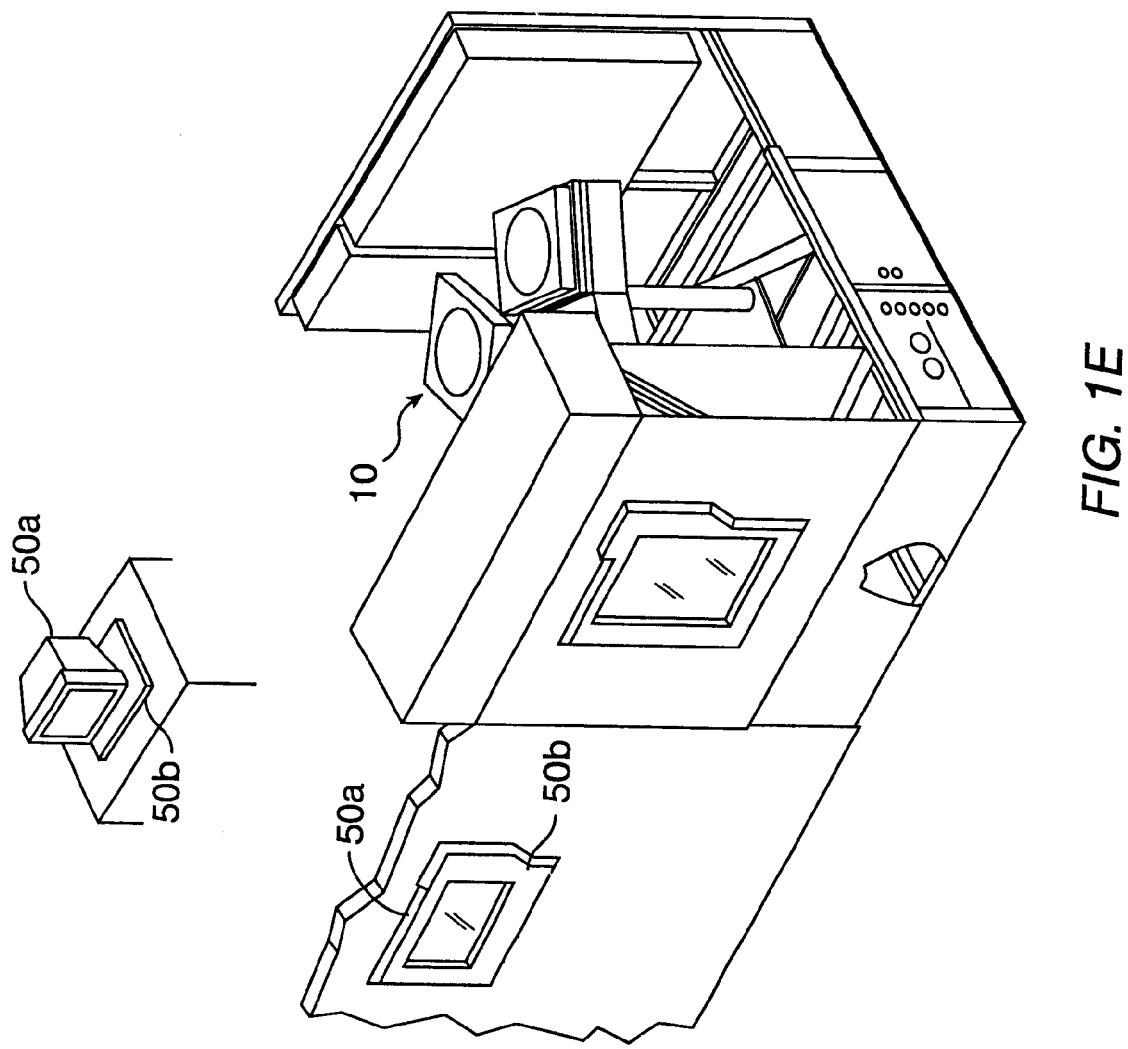
FIG. 1E is a simplified diagram of system monitor and CVD system in a multichamber system, which may include one or more chambers.

The interface between a user and the controller 34 is via a CAT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard mouse, or other pointing or communication device, may be used instead of or in addition to light pen 50b to allow the user to communicate with controller 34.

B. Integration of Remote Plasma Generator

Figure 2:
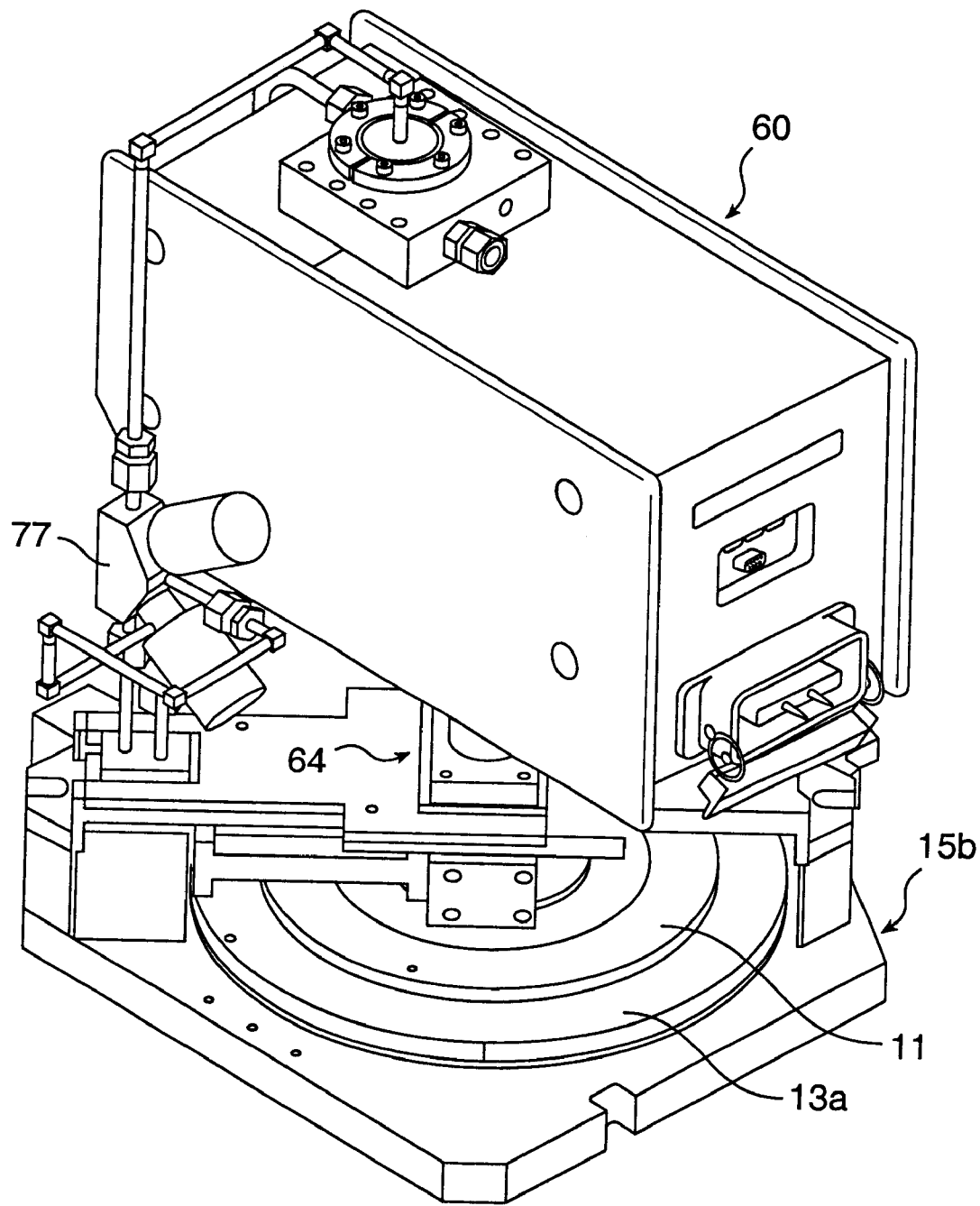
FIG. 2 is a perspective view of the remote plasma generator mounted on the lid of the CVD chamber of FIG. 1A in accordance with an embodiment of the invention.
Figure 3:
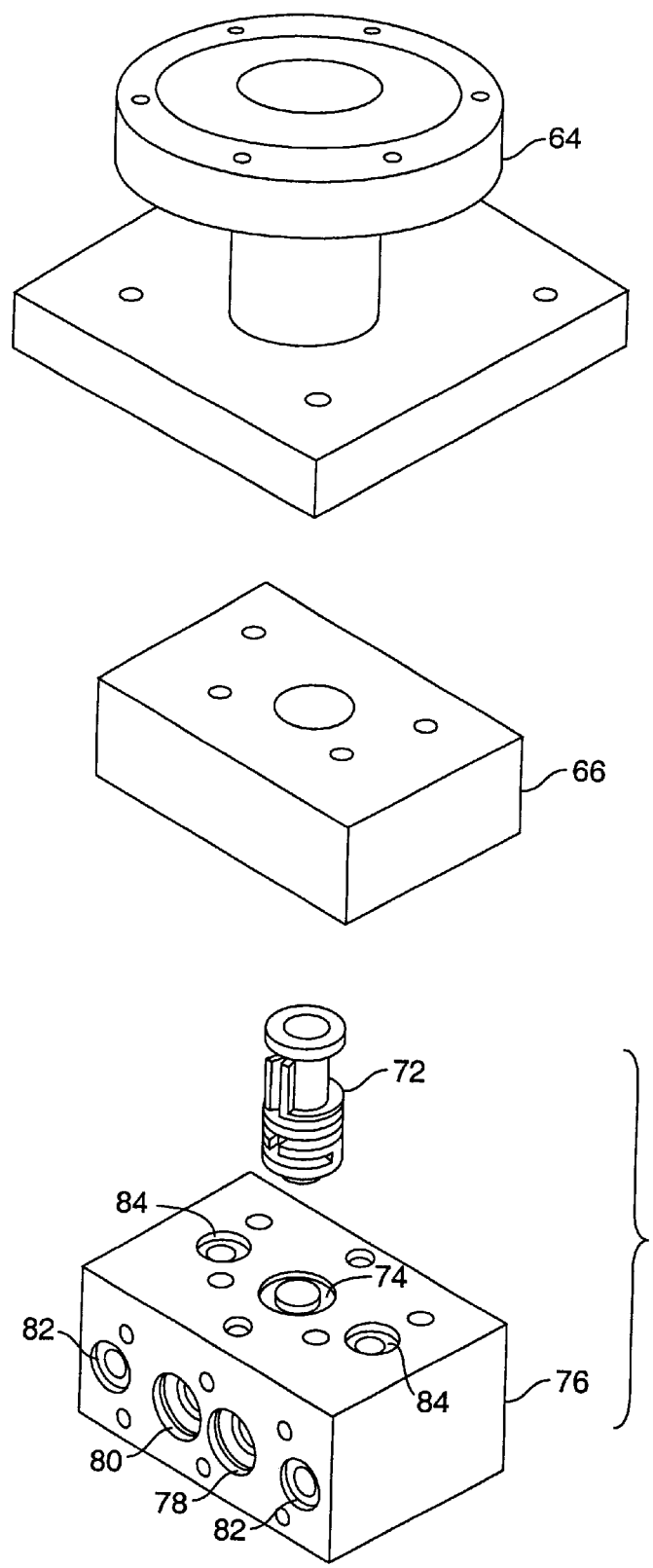
FIG. 3 is an exploded perspective view of part of the mounting assembly for mounting the remote plasma generator to the lid of the CVD chamber of FIG. 2.

FIGS. 1A and 2 show a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIGS. 1A and 3. The adaptor 64 is typically made of metal. A mixing device 70 is coupled to the upstream side of the gas distribution manifold 11 (FIG. 1A). The mixing device 70 includes a mixing insert 72 disposed inside a slot 74 of a mixing block 76 for mixing process gases FIG. 3). A ceramic isolator 66 is placed between the mounting adaptor 64 and the mixing device 70 (FIGS. 1A and 3). The ceramic isolator 66 is made of a ceramic material such as Al₂O₃ (99% purity), Teflon™, or the like. When installed, the mixing device 70 and ceramic isolator 66 form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. As shown in FIG. 2, a three-way valve 77 controls the flow of the process gases to the process chamber 15 either directly or through the remote plasma generator 60.

The remote plasma generator 60 is desirably a compact self-contained unit that can be conveniently mounted on the lid assembly 15b and be easily retrofitted onto existing chambers without costly and time-consuming modifications. One suitable unit is the ASTRON™ generator available frog Applied Science and Technology, Inc. of Woburn, Mass. The ASTRON™ generator utilizes a low-field toroidal (LFT™) plasma to dissociate a process gas. In one example, the plasma dissociates a process gas including a fluorine-containing gas such as NF₃ and a carrier gas such as argon to generate free fluorine which is used to clean film deposits in the process chamber 15.

Figure 4:
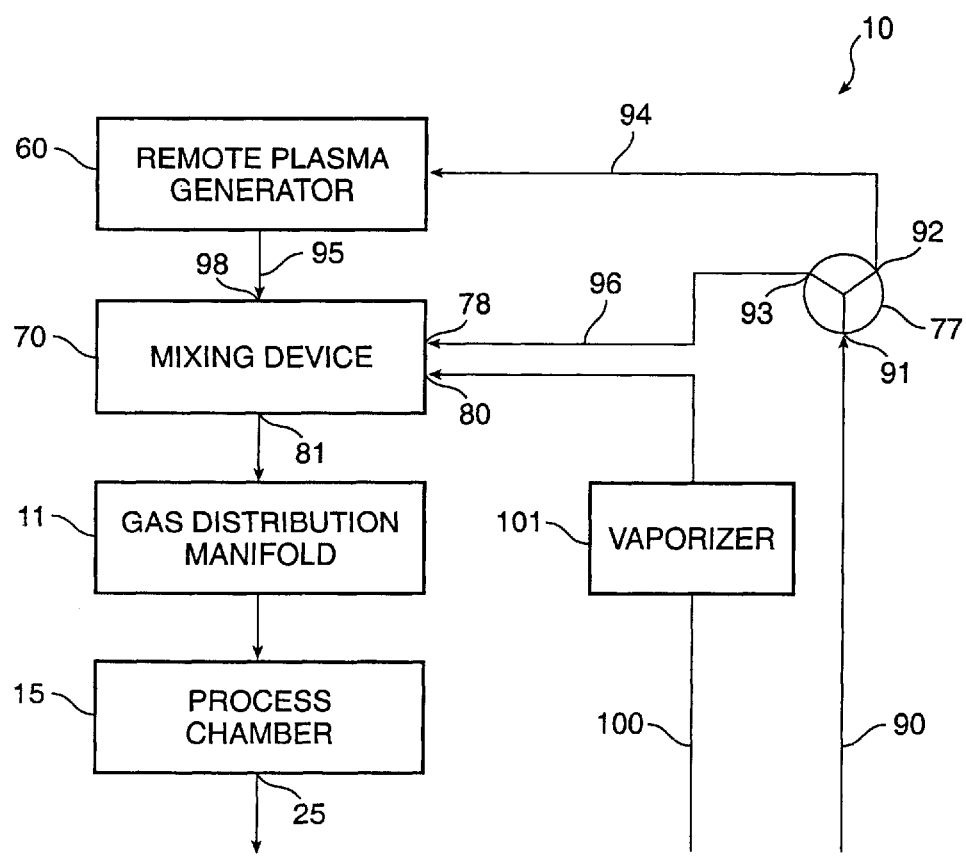
FIG. 4 is a simplified schematic diagram illustrating the flow of process gases through the CVD chamber and remote plasma generator of FIG. 1A.

As shown in FIGS. 3 and 4, the mixing block 76 includes two inlets 78, 80 for receiving process gases to be mixed therein and an outlet 81 at the bottom through which the gas mixture exits. Coolant inlets 82 and coolant outlets 84 are provided for circulating a coolant through the mixing block 76 for cooling (FIG. 3). Mixing of the process gases occurs in the mixing insert 72.

FIG. 4 schematically illustrates the gas flows through the CVD system 10 A first process gas from a first gas line 90 enters the three-way valve 77 at an inlet 91 and exits through either a first outlet 92 or a second outlet 93. The first outlet 92 leads to an intermediate conduit 94 through the remote plasma generator 60 to an upper conduit 95 coupled to an upper inlet 98 of the mixing block 76. The plasma in the generator 60 produces plasma species from the first process gas which are then flowed to the chamber 15 through the upper conduit 95, mixing device 70, and gas distribution manifold 11. As shown in FIG. 1A, the conduits through the ceramic insert 66 and mounting adaptor 64 form the upper conduit 95 fluidicly coupled between the remote plasma generator 60 and the mixing device 70.

Referring to FIG. 4, the second outlet 93 leads directly to the side inlet 78 of the mixing block 76 of the mixing device 70 via an inlet conduit 96, bypassing the remote plasma generator 60. A second process gas enters the mixing block 76 at the side inlet 80 via a second gas line 100. In a specific embodiment, a vaporizer 101 is coupled with the second gas line 100 for vaporizing a liquid precursor supplied to the second gas line 100. The process gases are mixed in the mixing insert 72 of the mixing device 70. The gas mixture exits the outlet 81 of the mixing block 76 and enters the chamber 15 through the gas distribution manifold 11. Exhaust gases exit the chamber 15 through the exhaust outlet 25.

Figure 5A:
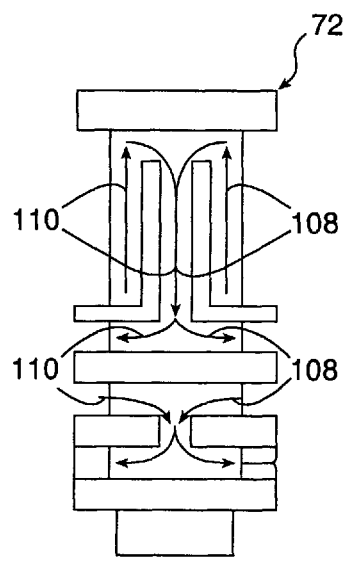
FIGS. 5A–5C are elevational views of a mixing insert according to an embodiment of the invention.
Figure 5B:
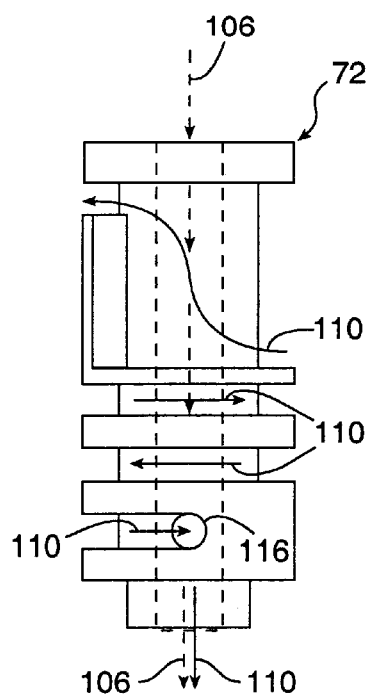
Figure 5C:
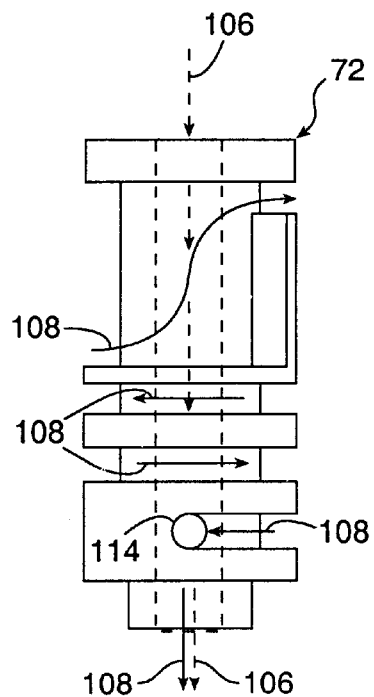

As best seen in the front elevational view of FIG. 5A and the side elevational views of FIGS. 5B and 5C, the mixing insert 72 includes a plurality of flow paths. The first flow path as indicated by dashed arrows 106 extends generally straight through the centerline of the insert 72 (FIGS. 5B and 5C) and is fluidicly coupled between the upper inlet 98 and outlet 81 of the mixing block 76 (FIG. 4). The second flow path as denoted by arrows 108 meanders through generally the right side of the insert 72 (FIGS. 5A and 5C) and is fluidicly coupled between the side inlet 78 and outlet 81 of the mixing block 76 (FIG. 4). The third flow path as denoted by arrows 110 meanders through generally the left side of the insert 72 (FIGS. 5A and 5E) and is fluidicly coupled between the side inlet 80 and outlet 81 of the mixing block 76 (FIG. 4). As seen in FIG. 5A, the second and third flow paths 108, 110 are partially overlapped at multiple locations, desirably at sharp turns to provide head-on mixing of the gases to induce thorough mixing. Near the bottom of the insert 72, the flow paths 108, 110 merge into the center through apertures 114, 116 (FIGS. 5A and 5B), respectively, with the last portion of the first flow path 106 to a common exit which is fluidicly coupled with the outlet 81 of the mixing block 76 (FIG. 4). The second and third flow paths 108, 100 are substantially longer than the first flow path 106, and include multiple turns to generate turbulence to facilitate thorough mixing of the first and second process gases from inlets 78, 80. The first flow path 106 is advantageously short and direct to the recombination of the plasma species produced in the remote plasma generator 60. In one embodiment, the first flow path 106 is about 1.5 inches long and the second and third flow paths 108, 110 are each about 7.5 inches long.

Figure 6:
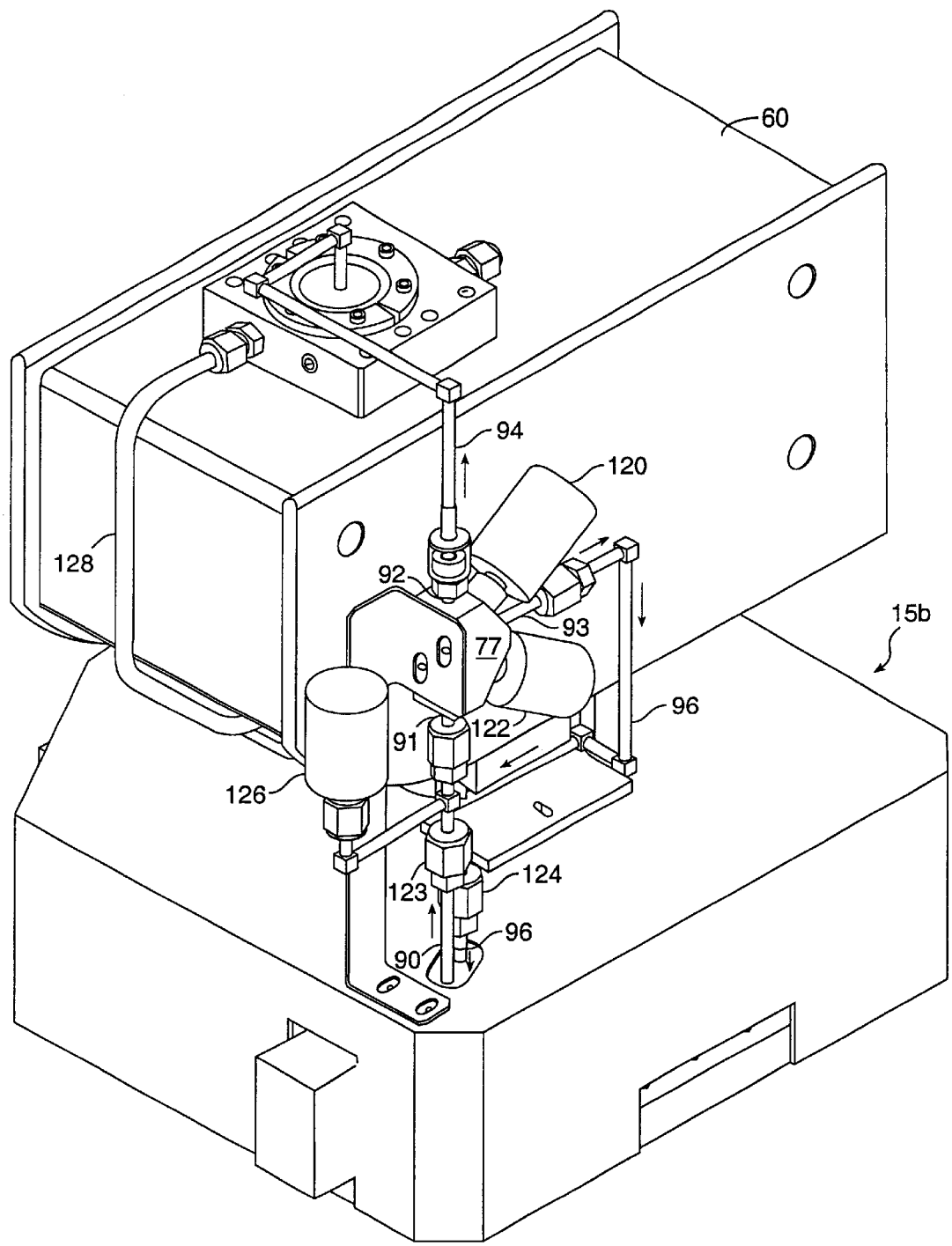
FIG. 6 is another perspective view of the remote plasma generator mounted on the lid of the CVD chamber of FIG. 1A.

The three-way valve 77 is mounted to the side of the remote plasma generator 60, as best seen in FIG. 6. The valve 77 is typically pneumatically operated, and includes a first pressure switch 120 that is coupled between the inlet 91 and the first outlet 92, and a second pressure switch 122 that is coupled between the inlet 91 and the second outlet 93. The inlet 91 of the valve 77 is connected with the first gas line 90. The first outlet 92 of the valve 77 is connected with the intermediate conduit 94 that leads to the remote plasma generator 60. The second outlet 93 of the valve 77 is connected with the inlet conduit 96 that leads to the chamber 15. The first pressure switch 120 is normally closed to block the flow from the inlet 91 to the first outlet 92, while the second pressure switch 122 is normally open to permit flow from the inlet 91 to the second outlet 93. In this mode, the first process gas flows to the chamber 15 via inlet conduit 96, bypassing the remote plasma generator 60. When the valve 77 is switched to the alternate mode, the first pressure switch 120 is open and the second pressure switch 122 is closed to direct the first process gas thorough the intermediate conduit 94 to the remote plasma generator 60 before entering the chamber 15.

Advantageously, the three-way valve 77 ensues that only gases that are to be dissociated by the remote plasma generator 60 will be flowed through the generator 60, and diverts other gases away from the generator 60. Although it is possible to flow other gases such as ozone through the generator 60 with the plasma turned off, long-term effects of such a practice are unknown. The use of the three-way valve 77 avoids any potential problems. Furthermore, the use of the valve 77 allows the same gas line 90 to be used for flowing different gases into the chamber 15 for different processes by directing the gases to the remote plasma generator 60 or bypassing the generator 60 as required. This configuration minimizes the number of gas lines needed, enhances serviceability of the system 10, and lessens the number of alterations that need to be made to the gas delivery system to retrofit existing chambers.

As shown in FIG. 6, a first connector 123 couples the upper and lower portions of the first gas line 90 together and a second connector 124 couples the upper and lower portions of the inlet conduit 96 together. The upper portions of the first gas line 90 and inlet conduit 96 are attached to the remote plasma generator 60, while the lower portions of the first gas line 90 and inlet conduit 96 are attached to the side of chamber 15. The disconnection of the upper portion of the first gas line 90 at the first connector 123 and of the upper portion of the inlet conduit 96 at the second connector 124 permits easy and quick removal of the lid assembly 15b. The three-way valve 77 is attached to the remote-plasma generator 60 which is mounted on the lid assembly 15b. The valve 77, generator 60, and lid assembly 15b can be conveniently removed and reinstalled together without disassembly.

FIG. 6 shows a safety pressure switch 126 coupled with the first gas line 90 to the three-way valve 77 to monitor the pressure at the inlet region. If the pressure builds up to a predetermined level, the safety pressure switch 126 produces a signal to shut down the input gas flow to prevent excessive pressure buildup and leakage. This is particularly important for toxic or dangerous process gases such as $NF_3$. FIG. 6 also shows a coolant line 128 connected to the remote plasma generator 60 for transporting coolant to cool the generator 60.

The exemplary embodiment shown in FIGS. 1A and 6 has a gas delivery system with a mixing device 70 that provides a flow path 106 for a gas from the remote plasma generator 60 into the chamber 15. The mixing device 70 further includes two partially overlapped flow paths 108, 110 for mixing process gases from two inlet gas lines 96, 100 and delivering the mixture to the chamber 15 (FIGS. 5A–5C). The gas delivery system typically operates in one of two modes. In a deposition mode, the first process gas flows from the first gas line 90 through the three-way valve 77 and the inlet conduit 96 to the mixing device 70 and the second process gas flows from the second gas line 100 to the mixing device 70 (FIG. 4). The mixing device 70 mixes the first and second process gases and delivers the mixture to the chamber 15 for depositing a layer on a substrate. In a cleaning mode, the supply for the second process gas is shut off. The first process gas is a cleaning plasma precursor and flows from the first gas line 90 through the three-way valve 77 and the intermediate conduit 94 to the remote plasma generator 60 (FIG. 4). The generator 60 forms a plasma to dissociate the precursor into cleaning plasma species and delivers the plasma species to the chamber 15 through the conduit 95 and mixing device 70 for cleaning deposits in the chamber 15. Of course, other modes of operation can be implemented. For instance, another mode may involve flowing a first process gas from the first gas line 90 through the remote plasma generator 60 to the chamber 15 and a second process gas directly to the chamber 15 via the second gas line 100.

It is appreciated that the gas delivery system can be modified relatively easily due to its modular construction. For example, the mixing insert 72 of FIGS. 3 and 5A–5C can be replaced, for instance, by one with a different mixing configuration. The mixing block 76 may also be replaced by one with additional inlets for receiving gases from more than two gas lines. These modifications provide further gas flow options to implement additional modes of gas mixing and delivery to the chamber 15 for performing different processes.

The use of the ceramic isolator 66 shown in FIGS. 1A and 3 eliminates instability caused by potential formation of a secondary plasma in the lid assembly 15b. In the system configuration shown in FIG. 1A, process gases may backstream through the upper conduit 95 formed by the conduits through the mounting adaptor 64 and ceramic insert 66. When a plasma is formed inside the chamber 15, the gas distribution manifold 11 and the mixing device 70 are RF hot. The metal mounting adaptor 64 is typically grounded. If a gas capable of striking a plasma such as helium is present in the conduit 95 between the RF hot manifold 11 and the grounded adaptor 64, a secondary plasma may form in the upper conduit 95. The secondary plasma may cause instability of the plasma inside the chamber 15, and result in deposition of a film with poor qualities such as a porous stack film. The presence of a gas such as helium in the upper conduit 95 is possible, for instance, during an $N_2$ treatment of the substrate which is common between the deposition of a PE (plasma-enhanced) film and the deposition of an SA (sub-atmospheric pressure) film in the formation of an in-situ stack film. The $N_2$ treatment is typically a plasma treatment using helium and nitrogen gases and striking a plasma in the chamber 15. Helium may backstream into the upper conduit 95 during the $N_2$ treatment. Because the gas distribution manifold 11 and mixing device 70 are RF hot and the mounting adaptor 64 is grounded, the presence of helium in the upper conduit 95 between the manifold 11 and the adaptor 64 may induce a secondary plasma to form in the conduit 95 and cause instability of the plasma inside the chamber 15. By isolating the metal adaptor 64 from the mixing device 70 and gas distribution manifold 11, the ceramic isolator 66 minimizes the potential for generating a secondary plasma in the upper conduit 95.

It is appreciated that secondary plasma is a potential problem when an in situ plasma process is carried out in the chamber. Secondary plasma is more likely in the $N_2$ treatment because the ionization potentials for $N_2$ and He are among the lowest for all gases.

II. Exemplary Process Flow

Figure 7:
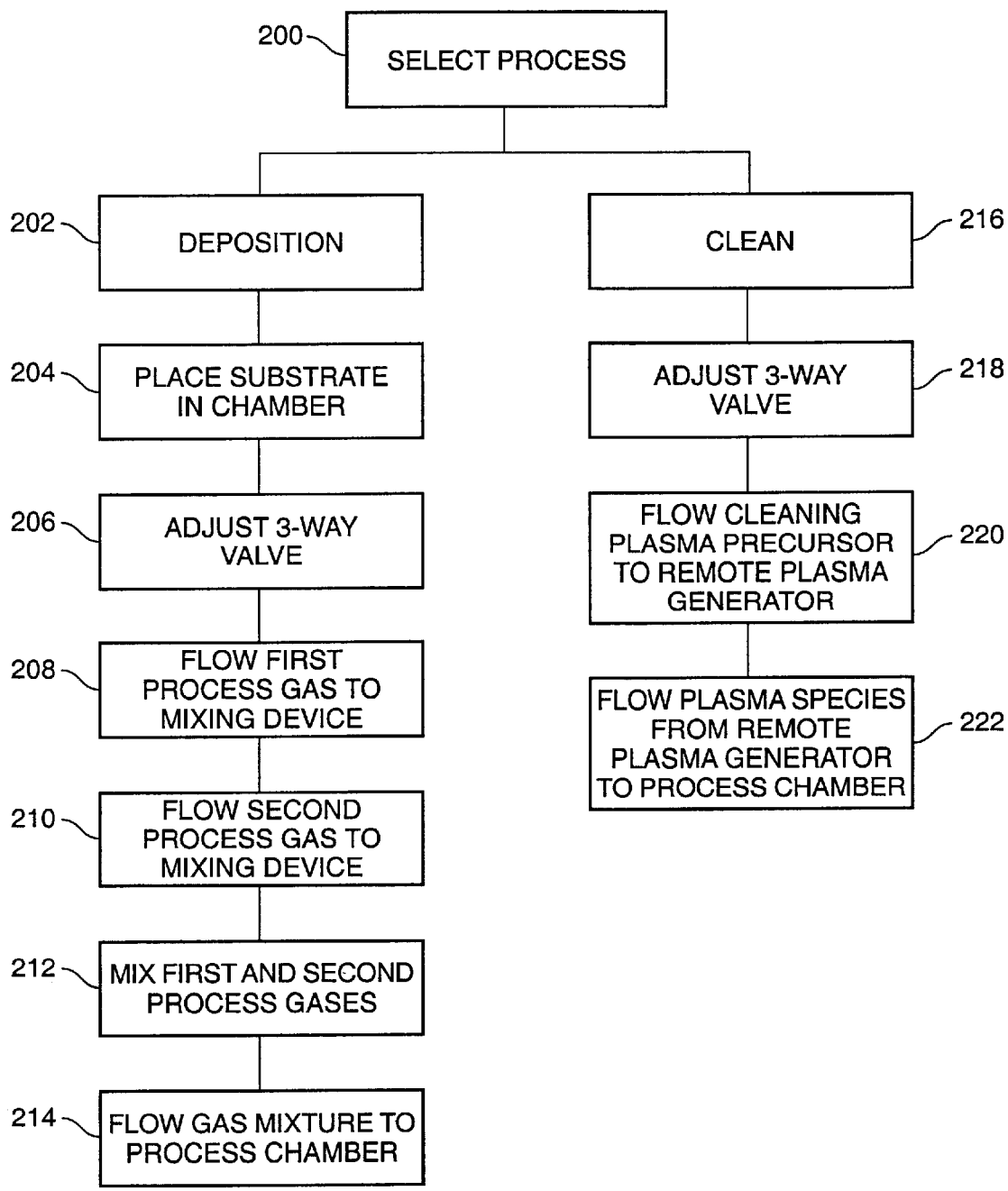
FIG. 7 is a simplified flow chart illustrating the processes according to an embodiment of the invention.

The simplified flow chart of FIG. 7 illustrates the use of the CVD system 10 of FIGS. 1A–7 to carry out deposition and clean processes. At step 200 in the beginning of the process, a process mode is selected. In the deposition mode (step 202), a substrate is provided in the chamber 15 (step 204). The three-way valve 77 is switched to bypass the remote plasma generator 60 (FIG. 4) at step 206. A first process gas is directed from the first inlet line 90 through the three-way valve 77 and the inlet conduit 96 to the mixing device 70 (step 280). At step 210, a second process gas is flowed to the mixing device 70 via the second inlet line 100 (FIG. 4). The mixing device 77 (FIGS. 5A–5C) mixes the first and second process gases at step 212. The gas mixture is flowed into the chamber 15 to deposit a layer on the substrate (step 214). In one example, the first process gas includes ozone, and the second process gas includes TEOS.

In the clean mode (step 216) of FIG. 7, the three-way valve 77 (FIG. 4) is switched to direct the flow to the remote plasma generator 60 at step 218. A cleaning plasma precursor is flowed from the first inlet line 90 through the three-way valve 77 to the generator 60 which dissociates the precursor to generate cleaning plasma species (step 220). The plasma species are flowed from the remote plasma generator 60 through the mixing device 70 to the chamber 15 to clean the chamber 15 (FIG. 4) at step 222. In one example, the cleaning plasma precursor includes a fluorine-containing gas such as $NF_3$ and argon. The plasma in the generator 60 dissociates the $NF_3$ to generate free fluorine for cleaning deposits in the process chamber 15.

It is found that the clean time can generally be reduced if the pressure in the remote plasma generator 60 is higher, preferably substantially higher, than the pressure in the chamber 15. For example, the pressure in the remote plasma generator 60 is desirably at least about 10 times, and more desirably at least about 30 times, the pressure in the chamber 15. In a specific embodiments, the pressure in the chamber 15 is about 0.25 torr, and the pressure in the remote plasma generator 60 is about 8 torr. The system controller 34 can be used to control the pressure in the remote plasma generator 60 as well as the pressure in the chamber 15.

While the above is a complete description of specific embodiments of the present invention, various modifications, variations, and alternatives may be employed. For example, the three-way valve may be replaced by other flow control devices for directing gas flow between alternate flow paths. The mixing device may have other configurations and mixing patterns. Other variations will be apparent to persons of skill in the art. These equivalents and alternatives are included within the scope of the present invention. Therefore, the scope of this invention is not limited to the embodiments described, but is defined by the following claims and their full scope of equivalents.

What is claimed is:

1. A substrate processing system comprising:
   a housing defining a process chamber;
   a substrate support for supporting a substrate during substrate processing in the process chamber;
   a remote plasma generator having an inlet and an outlet; and
   a gas delivery system for introducing gases into the process chamber, the gas delivery system including
      a three-way valve having a valve inlet, a fist valve outlet, and a second valve outlet, the three-way valve being adjustable to switch flow between a first valve path from the valve inlet to the first valve outlet and a second valve path from the valve inlet to the second valve outlet;
      a first inlet flow conduit coupled between the outlet of the remote plasma generator and the process chamber;
      a remote plasma conduit coupled between the first valve outlet of the three-way valve and the inlet of the remote plasma generator; and
      a second inlet flow conduit coupled between the second valve outlet of the three-way valve and the process chamber.

2. The substrate processor system of claim 1 wherein the three-way valve is pneumatically operated.

3. The substrate processing system of claim 1 wherein the gas delivery system further includes a third inlet flow conduit coupled with the process chamber.

4. The substrate processing system of claim 3 wherein the gas delivery system further includes a vaporizer coupled with the third inlet flow conduit.

5. The substrate processing system of claim 3 wherein the first inlet flow conduit, the second inlet flow conduit, and the third inlet flow conduit are coupled with the process chamber at a chamber inlet disposed generally above the substrate support.

6. The substrate processing system of claim 3 wherein the gas delivery system further includes a mixing device, the mixing device having an outlet coupled with the process chamber, a first inlet coupled with the first inlet flow conduit, a second inlet coupled with the second inlet flow conduit, and a third inlet coupled with the inlet flow conduit.

7. The substrate processing system of claim 6 wherein the mixing device has a first flow path between the first inlet and the outlet, a second flow path between the second inlet and the outlet, and a third flow path between the third inlet and the outlet, the second flow path and third flow path being at least partially overlapped.

8. The substrate processing system of claim 7 wherein the first flow path is substantially shorter in length than the second and third flow paths.

9. The substrate processing system of claim 7 wherein the second and third flow paths include a plurality of turns.

10. The substrate processing apparatus of claim 1 wherein the remote plasma generator is mounted on a lid of the process chamber disposed generally above the substrate sport.

11. The substrate processing apparatus of claim 10 further comprising a ceramic isolator coupled between the remote plasma generator and the process chamber, the ceramic isolator including a flow passage forming a portion of the first inlet flow conduit coupled between the outlet of the remote plasma generator and the process chamber.

12. The substrate processing apparatus of claim 11 wherein the process chamber includes a gas distribution manifold having a plurality of outlet apertures disposed above the substrate, the gas distribution manifold being fluidicly coupled with the flow passage of the ceramic isolator.

13. A substrate processing system comprising:
   a housing defining a process chamber;
   a substrate support for supporting a substrate during substrate processing in the process chamber;
   a remote plasma generator;
   a first gas line;
   a second gas line;
   a first gas supply for a first gas;
   a second gas supply for a second gas;
   a third gas supply for a third gas; and
   means for coupling the first gas supply with the first gas line to flow the first gas through the first gas line and the remote plasma generator to the process chamber during a first operation, and for coupling the second gas supply with the first gas line to flow the second gas through the first gas line to the process chamber bypassing the remote plasma generator, coupling the third gas supply with the second gas line to flow the third gas into the process chamber, and mixing the second gas and the third gas together prior to flowing the second and third gases into the process chamber, in a second operation.

14. The substrate processing apparatus of claim 13 further comprising a ceramic isolator having a flow passage fluidicly coupled between the remote plasma generator and the process chamber.

15. The substrate processing apparatus of claim 14 wherein the process chamber includes a gas distribution manifold having a plurality of outlet apertures disposed above the substrate, the gas distribution manifold being fluidicly coupled with the flow passage of the ceramic isolator.

16. The substrate processing apparatus of claim 13 wherein the housing includes a lid disposed generally above the substrate support and wherein the remote plasma generator is mounted on the lid.

17. The substrate processing system of claim 13 further comprising a vaporizer coupled with the second gas line.

18. The substrate processing system of claim 13 further comprising means for controlling pressure in the remote plasma generator and pressure in the process chamber.

19. The substrate processing system of claim 18 wherein the controlling means includes instructions for providing a pressure in the remote plasma generator which is higher than the pressure in the process chamber.

20. The substrate processing system of claim 19 wherein the controlling means includes instructions for providing a pressure in the remote plasma generator which is at least about 10 times the pressure in the process chamber.

21. The substrate processing system of claim 20 wherein the controlling means includes instructions for providing a pressure in the remote plasma generator which is at least about 30 times the pressure in the process chamber.

* * * * *